United States Patent
Ryu et al.

(10) Patent No.: US 12,238,903 B2
(45) Date of Patent: Feb. 25, 2025

(54) WATER-COOLED HEAT DISSIPATION MODULE ASSEMBLY

(71) Applicant: DONG YANG PISTON CO., LTD., Ansan-si (KR)

(72) Inventors: Kwan Ho Ryu, Ansan-si (KR); Jeong Keun Lee, Incheon (KR); Min Woo Lee, Hwaseong-si (KR); Ju Hyun Sun, Siheung-si (KR); Tae Keun Park, Siheung-si (KR); Kang Wook Park, Yongin-si (KR); Lee Cheol Ji, Ansan-si (KR); Hyeok Chul Yang, Ansan-si (KR); Tae Heon Kim, Siheung-si (KR); Keun Jae Lee, Ansan-si (KR)

(73) Assignee: DONG YANG PISTON CO., LTD., Ansan-si (KR)

( * ) Notice: Subject to any disclaimer, the term of this patent is extended or adjusted under 35 U.S.C. 154(b) by 0 days.

(21) Appl. No.: 18/011,744

(22) PCT Filed: Aug. 4, 2022

(86) PCT No.: PCT/KR2022/011536
§ 371 (c)(1),
(2) Date: Dec. 20, 2022

(87) PCT Pub. No.: WO2023/085556
PCT Pub. Date: May 19, 2023

(65) Prior Publication Data
US 2024/0121924 A1 Apr. 11, 2024

(30) Foreign Application Priority Data
Nov. 10, 2021 (KR) .......................... 10-2021-0154154

(51) Int. Cl.
*H05K 7/20* (2006.01)
*B29C 65/44* (2006.01)
*B29L 31/18* (2006.01)

(52) U.S. Cl.
CPC ......... *H05K 7/20927* (2013.01); *B29C 65/44* (2013.01); *H05K 7/20254* (2013.01); *H05K 7/20272* (2013.01); *B29L 2031/18* (2013.01)

(58) Field of Classification Search
None
See application file for complete search history.

(56) References Cited

U.S. PATENT DOCUMENTS 5,966,291 A * 10/1999 Baumel .............. H05K 7/20927
165/80.4
9,003,649 B1 * 4/2015 Romero ............... B23K 20/127
29/830
(Continued)

FOREIGN PATENT DOCUMENTS

| KR | 10-2012-0078707 A | 7/2012 |
| KR | 10-1804334 B1 | 12/2017 |

(Continued)

OTHER PUBLICATIONS

Notice of Reason for Refusal of priority Korean Patent Application No. 10-2021-0154154, issued on Jul. 31, 2023.

*Primary Examiner* — Courtney L Smith
(74) *Attorney, Agent, or Firm* — Bridgeway IP Law Group, PLLC; Sang Ho Lee; Hyun Woo Shin

(57) ABSTRACT

A water-cooled heat dissipation module assembly capable of cooling a power module of a vehicle driving inverter system using a battery or fuel cell. The water-cooled heat dissipation module assembly includes a housing unit provided in the form of a housing having an opening portion at least partially opened at one side thereof. The housing unit and at least a part of a rim region of the cooling unit are made of (Continued)

a plastic material, and the housing unit and the cooling unit are joined to each other by plastic welding using a laser.

8 Claims, 3 Drawing Sheets

(56) References Cited

U.S. PATENT DOCUMENTS

| | | | |
|---|---|---|---|
| 9,030,835 | B2 | 5/2015 | Frenzel et al. |
| 9,111,900 | B2* | 8/2015 | Bogen ................ H01L 23/3675 |
| 10,388,589 | B2* | 8/2019 | Kawase ................ H01L 25/072 |
| 2001/0014029 | A1* | 8/2001 | Suzuki ............... H05K 7/20927 |
| | | | 363/141 |
| 2008/0237847 | A1* | 10/2008 | Nakanishi ................ F28F 3/12 |
| | | | 257/722 |
| 2013/0050966 | A1 | 2/2013 | Frenzel et al. |
| 2014/0185243 | A1 | 7/2014 | Joo et al. |
| 2021/0176896 | A1* | 6/2021 | Yang ................ H05K 7/20636 |
| 2023/0268251 | A1* | 8/2023 | Chen ................... B23K 20/122 |
| | | | 257/690 |

FOREIGN PATENT DOCUMENTS

| | | |
|---|---|---|
| KR | 10-2069610 B1 | 1/2020 |
| KR | 10-2176925 B1 | 11/2020 |
| KR | 10-2021-0045155 A | 4/2021 |
| KR | 10-2021-0085730 A | 7/2021 |
| WO | 2019/059539 A1 | 3/2019 |

* cited by examiner

SECTION A-A

WATER-COOLED HEAT DISSIPATION MODULE ASSEMBLY

TECHNICAL FIELD

The present invention relates to a water-cooled heat dissipation module assembly, and more particularly, to a water-cooled heat dissipation module assembly capable of cooling a power module of a vehicle driving inverter system using a battery or a fuel cell.

BACKGROUND ART

Recently, electric vehicles have been considered as necessary means for implementing environmentally friendly technologies and solving social issues such as energy depletion. The electric vehicle operates using a motor that outputs power by being supplied with electricity from a battery. Because the electric vehicle emits no carbon dioxide, generates very low noise, and uses the motor with energy efficiency higher than energy efficiency of an internal combustion engine, the electric vehicle is in the limelight as an environmentally friendly vehicle.

An electric vehicle (EV) or a fuel cell electric vehicle (FCEV) uses a motor to drive the vehicle, and the motor requires an inverter system. The inverter system refers to a power conversion device that converts high-voltage direct current power, which is generated by a battery or a fuel cell, into three-phase (U-phase, V-phase, and W-phase) alternating current power. The inverter system includes a power module including a power conversion switching element (insulated gate bipolar transistor (IGBT)), a gate drive circuit, and the like. When the inverter system operates, switching elements such as the power module generate a large amount of heat, and a cooling structure such as a heat sink is adopted to perform the cooling operation.

In general, a water-cooled heat dissipation module assembly for a vehicle may include a housing unit in which a coolant flows, and a cooling unit fastened to seal one side of the housing unit. In this case, a plurality of cooling fins is formed on one surface of the cooling unit that seals the housing unit. The plurality of cooling fins performs heat exchange while coming into contact with the coolant flowing in the housing unit. The power module is attached to an outer surface of the portion where the plurality of cooling fins is formed, such that the power module may be cooled. The water-cooled heat dissipation module assembly may have better cooling characteristics than an air-cooled heat dissipation module assembly.

DISCLOSURE

Technical Problem

However, in the water-cooled heat dissipation module assembly in the related art, both the housing unit and the cooling unit are made of a metallic material such as aluminum and manufactured by a casting process such as die casting, which increases manufacturing costs and causes an excessively heavy weight. For this reason, there is a problem in that the above-mentioned configuration adversely affects energy efficiency of the vehicle, which causes deterioration in electric power economy of the electric vehicle. In addition, there is a problem in that it is difficult to perform a process of joining and integrating the housing unit and the cooling unit that are made of a metallic material, which degrades manufacturability and increases process costs.

The present invention has been made in an effort to solve the above-mentioned problem, and an object of the present invention is to provide a water-cooled heat dissipation module assembly, in which a housing unit and a cooling unit are made of a nonmetallic material, which may reduce weights of components and manufacturing costs and improve manufacturability. However, the object of the present invention is illustrative, and the scope of the present invention is not limited by the object.

Technical Solution

An embodiment of the present invention provides a water-cooled heat dissipation module assembly. The water-cooled heat dissipation module assembly may include: a housing unit provided in the form of a housing having an opening portion at least partially opened at one side thereof, the housing unit having therein a flow space in which a coolant flows, the housing unit including a coolant inlet port provided at one side thereof, and a coolant discharge port provided at the other side thereof, so that the coolant is introduced into or discharged from the flow space; and a cooling unit provided in the form of a plate and coupled to the opening portion of the housing unit, the cooling unit including a plurality of cooling fins formed on one surface directed toward the flow space of the housing unit and configured to cool a power module attached to the other surface, in which the housing unit and at least a part of a rim region of the cooling unit are made of a plastic material, and the housing unit and the cooling unit are joined to each other by plastic welding using a laser.

According to the embodiment of the present invention, the housing unit is made of a plastic material, the cooling unit may include: a cooling plate made of a metallic material and having a plate shape corresponding to a shape of the opening portion of the housing unit; and a junction part formed at a position corresponding to a periphery of the opening portion of the housing unit and made of a permeable plastic material, the junction part being formed along a rim portion of the cooling plate while surrounding at least a part of the rim portion of the cooling plate.

According to the embodiment of the present invention, the housing unit may include a junction protrusion portion protruding in a ring shape along the periphery of the opening portion, and the junction part of the cooling unit may include a junction groove portion concavely formed in a ring shape at a position corresponding to the junction protrusion portion so as to accommodate at least a part of the junction protrusion portion.

According to the embodiment of the present invention, the junction protrusion portion may have a thickness smaller than a width of the junction groove portion and have a height larger than a depth of the junction groove portion.

According to the embodiment of the present invention, the housing unit having the junction protrusion portion may be made of an impermeable plastic material and formed as an absorption layer that absorbs a laser beam emitted from a laser welding device, and the junction part of the cooling unit having the junction groove portion may be made of a permeable plastic material and formed as a transmission layer that transmits the laser beam emitted from the laser welding device.

According to the embodiment of the present invention, the junction part may be formed along the rim portion of the cooling plate by insert injection molding.

According to the embodiment of the present invention, the plurality of cooling fins made of a metallic material may be formed on one surface of the cooling plate that is directed toward the flow space of the housing unit.

According to the embodiment of the present invention, the cooling plate may include an insert groove portion formed in least one of one surface, on which the plurality of cooling fins is formed, and the other surface opposite to one surface, the insert groove portion being concavely formed in a portion surrounded by the junction part along the rim portion of the cooling plate, and the junction part may include an insert coupling portion protruding along the insert groove portion and having a shape corresponding to the insert groove portion.

According to the embodiment of the present invention, the housing unit may include: a first connector having a nipple shape, provided on the coolant inlet port, and configured to connect the coolant inlet port and a coolant tube; and a second connector having a nipple shape, provided on the coolant discharge port, and configured to connect the coolant discharge port and the coolant tube.

According to the embodiment of the present invention, the first connector and the second connector may be made of a plastic material and integrated with the housing unit.

Advantageous Effects

According to the embodiment of the present invention configured as described above, a part of the cooling unit is made of a plastic material, except for all the parts of the housing unit and the portion where the plurality of cooling fins, which exchanges heat with the coolant, is formed. Because most of the components are made of a nonmetallic material, the weight of the product may be reduced, and energy efficiency of vehicles to which the product is applied may be improved.

In addition, the water-cooled heat dissipation module assembly having the following effects may be implemented. The housing unit and the cooling unit are manufactured by plastic injection molding, which makes it possible to reduce the costs required to manufacture the components. Further, the housing unit and the cooling unit are integrated by being joined to each other by plastic welding using a laser, which makes it possible to improve manufacturability and reduce process costs. Of course, the scope of the present invention is not limited by the effects.

MODE FOR INVENTION

Figure 1:
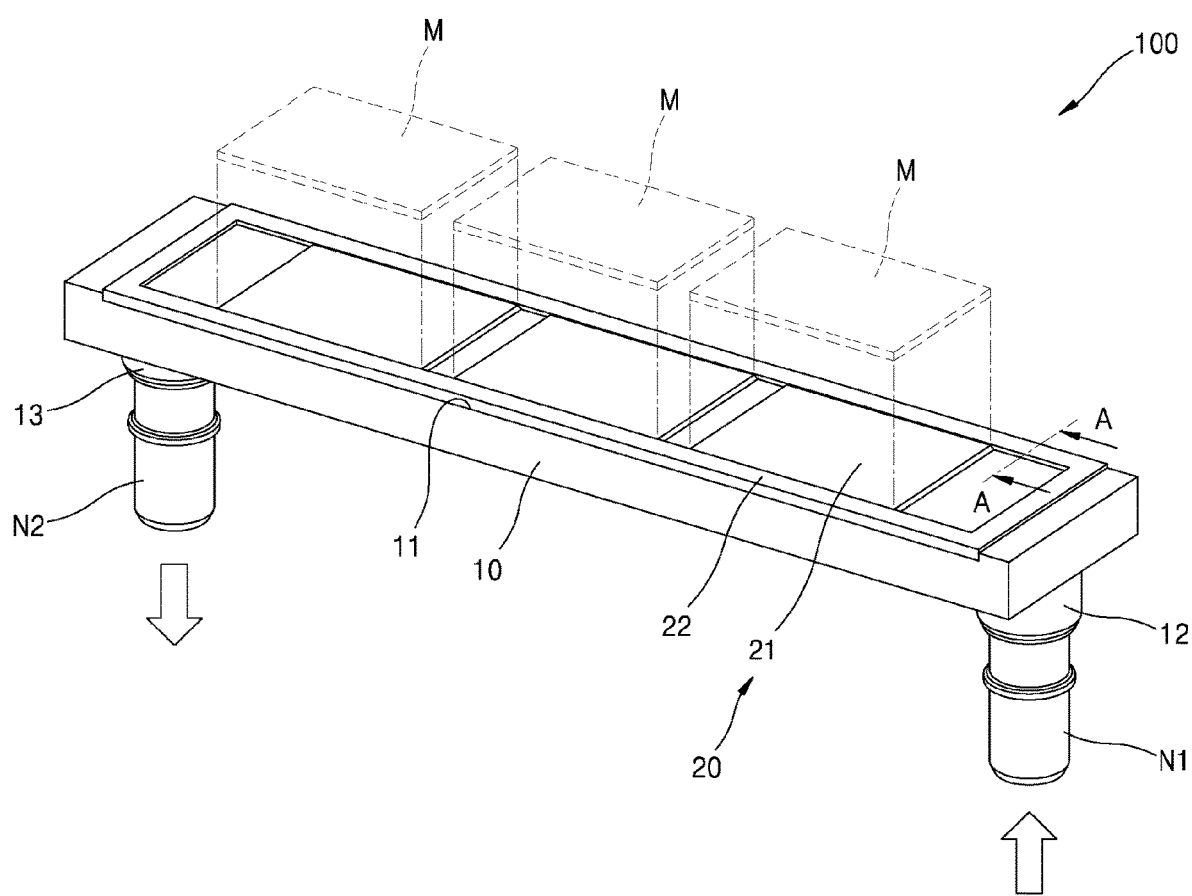
FIG. 1 is a perspective view schematically illustrating a water-cooled heat dissipation module assembly according to an embodiment of the present invention.

Hereinafter, exemplary embodiments of the present invention will be described in detail with reference to the accompanying drawings.

Embodiments of the present invention are provided to more completely explain the present invention to those skilled in the art. The following embodiments may be modified in various forms, and the scope of the present invention is not limited to the following embodiments. The embodiments are provided to make the present invention more thorough and complete, and to completely convey the spirit of the present invention to those skilled in the art. In addition, a thickness or size of each layer illustrated in the drawings is exaggerated for the purpose of clarity and for convenience of description.

Hereinafter, the embodiments of the present invention will be described with reference to the drawings that schematically illustrate ideal embodiments of the present invention. In the drawings, for example, depending on manufacturing techniques and/or tolerance, variations of the illustrated shape may be expected. Therefore, it should be interpreted that the embodiments based on the spirit of the present invention are not limited to particular shapes of regions illustrated in the present specification but include changes in shapes made during a manufacturing procedure, for example.

Figure 2:
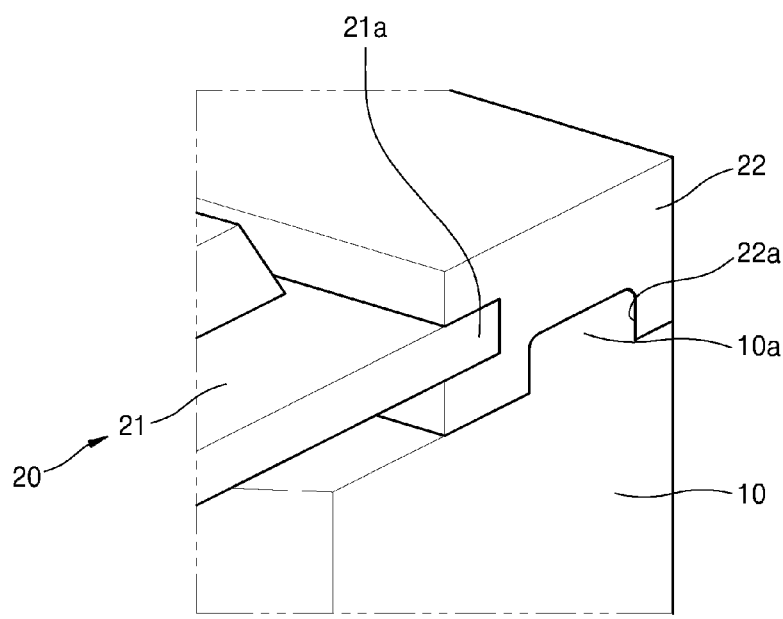
FIG. 2 is a perspective view schematically illustrating a cross-section taken along line A-A in FIG. 1.
Figure 3:
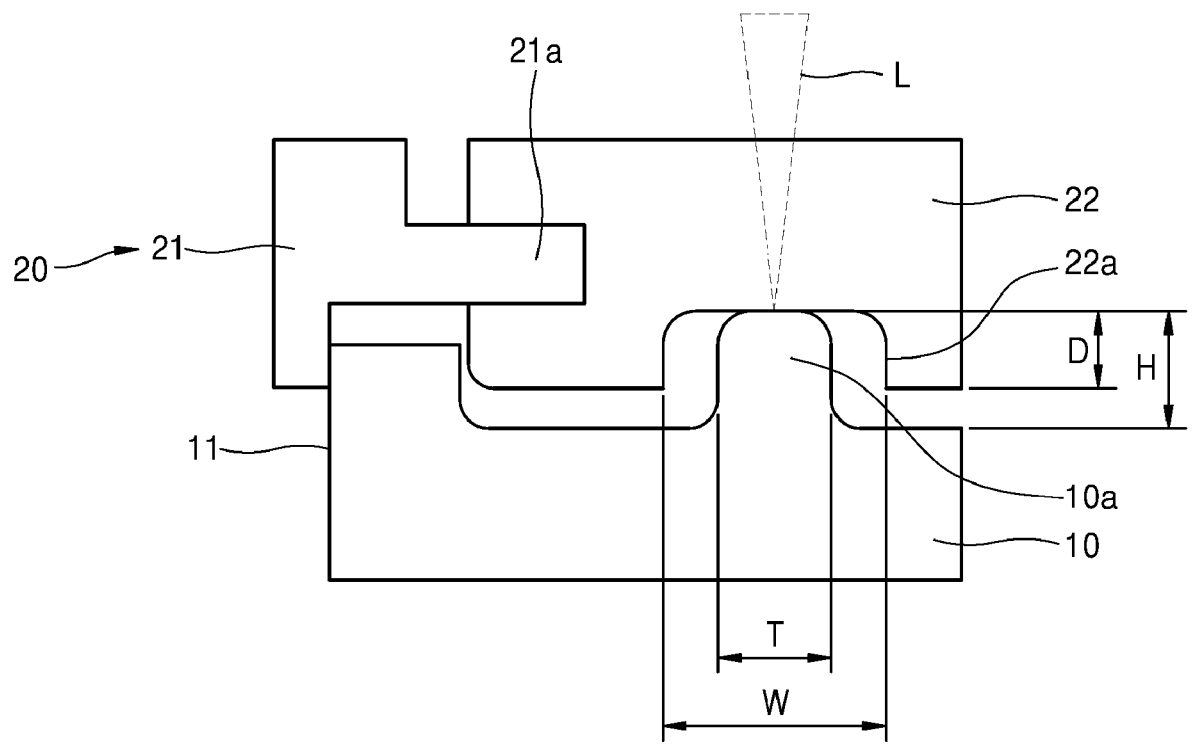
FIGS. 3 and 4 are cross-sectional views illustrating a process of joining a housing unit and a cooling unit at a portion in FIG. 2.
Figure 4:
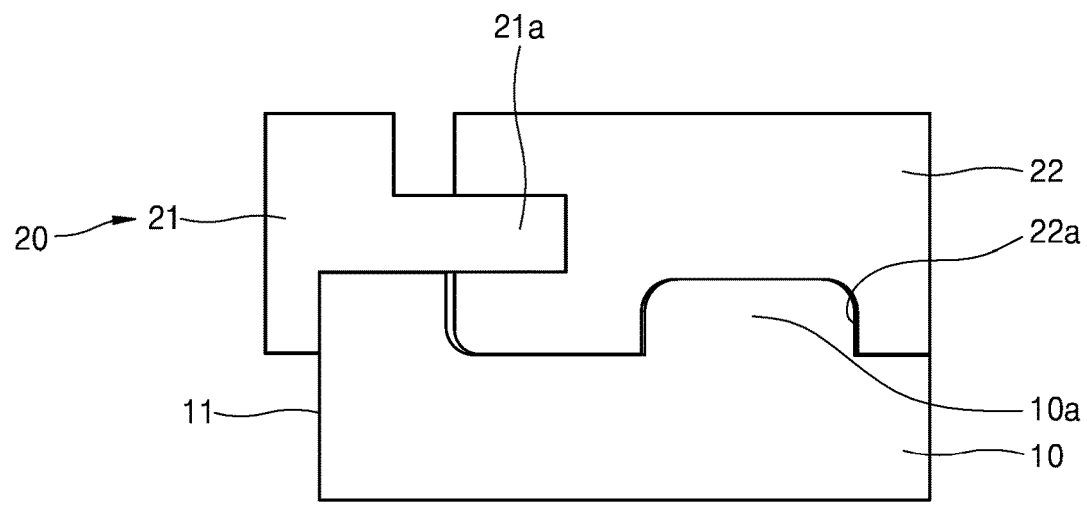
Figure 5:
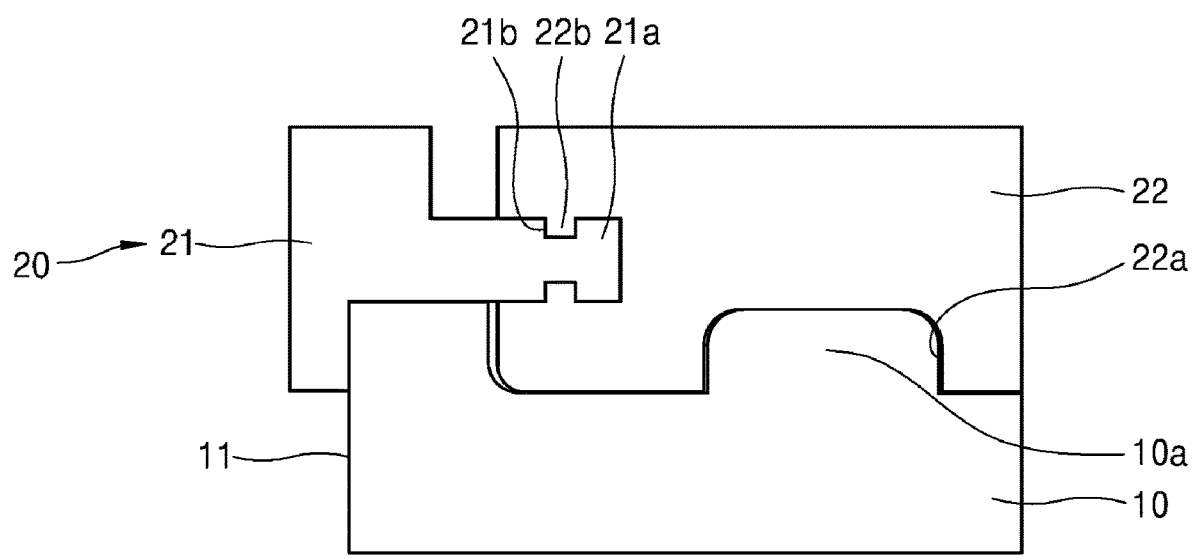
FIG. 5 is a cross-sectional view illustrating another embodiment of the housing unit and the junction part of the cooling unit in FIG. 2.

FIG. 1 is a perspective view schematically illustrating a water-cooled heat dissipation module assembly 100 according to an embodiment of the present invention, FIG. 2 is a perspective view schematically illustrating a cross-section taken along line A-A in FIG. 1, FIGS. 3 and 4 are cross-sectional views illustrating a process of joining a housing unit 10 and a cooling unit 20 at a portion in FIG. 2, and FIG. 5 is a cross-sectional view illustrating another embodiment of the housing unit 10 and the junction part of the cooling unit 20 in FIG. 2.

First, as illustrated in FIG. 1, a water-cooled heat dissipation module assembly 100 according to an embodiment of the present invention may broadly include a housing unit 10 and a cooling unit 20.

As illustrated in FIG. 1, the housing unit 10 is provided in the form of a housing having an opening portion 11 at least partially opened at one side thereof and has a flow space in which a coolant may flow. A coolant inlet port 12 may be formed at one side of the housing unit 10, and a coolant discharge port 13 may be formed at the other side of the housing unit 10, such that the coolant may be introduced into or discharged from the flow space.

In addition, the cooling unit 20 is provided in the form of a plate and coupled to the opening portion 11 of the housing unit 10 so as to close the opening portion 11 of the housing unit 10, which is opened at one side thereof, and seal the flow space from the outside. A plurality of cooling fins is formed on one surface of the housing unit 10 that is directed toward the flow space, such that a power module M attached to the other surface of a region in which the plurality of cooling fins is formed may be cooled.

For example, the cooling unit 20 may be coupled to the housing unit 10 so that one surface on which the plurality of cooling fins is formed is directed toward the flow space. Therefore, the plurality of cooling fins formed on the cooling unit 20 may exchange heat with the coolant, which flows in the flow space of the housing unit 10, while coming into direct contact with the coolant, such that the power module M, which is attached to the other surface of the region in which the plurality of cooling fins of the cooling unit 20 is formed may be cooled.

In addition, although not illustrated, a thermal grease layer may be formed between contact surfaces of the cooling unit 20 and the power module M and formed by applying thermal grease. The thermal grease layer may fill a fine gap between the cooling unit 20 and the power module M to facilitate heat transfer and improve cooling characteristics.

As described above, the power module M is cooled by the cooling operation, i.e., the heat exchange between the coolant flowing in the flow space of the housing unit 10 and the plurality of cooling fins of the cooling unit 20. The power module M is typically called a power semiconductor module and has an insulated gate bipolar transistor (IGBT), a MOSFET, a bipolar transistor, or the like. The power module M may be configured by disposing a DBC (direct bonded copper) substrate on an upper surface of a base plate and attaching a semiconductor chip to the DBC substrate.

The entire portion of the housing unit 10 and at least a part of a rim region of the cooling unit 20 may be made of a plastic material so that the housing unit 10 and the cooling unit 20 may be joined by plastic welding using a laser.

For example, as illustrated in FIGS. 1 and 2, the housing unit 10 may be made of an impermeable plastic material. In addition, the cooling unit 20 is provided in the form of a plate corresponding to a shape of the opening portion 11 of the housing unit 10. The plurality of cooling fins is formed on one surface of the housing unit 10 that is directed toward the flow space. The cooling unit 20 may include a junction part 22 formed at a position corresponding to a periphery of a cooling plate 21 made of a metallic material, as a whole, and to a periphery of the opening portion 11 of the housing unit 10. The junction part is formed along a rim portion 21a of the cooling plate 21 while surrounding at least a part of the rim portion 21a of the cooling plate 21, and the junction part is made of a permeable plastic material.

More specifically, the cooling plate 21 of the cooling unit 20, on which the plurality of cooling fins is formed, may be made of copper having high thermal conductivity so that the coolant flowing in the flow space of the housing unit 10 may smoothly exchange heat with the power module M. However, the material of the cooling plate 21 is not necessarily limited to copper. All the metallic materials, such as aluminum, magnesium, or steel, which may induce thermal conduction, may be applied.

In addition, the junction part 22 between the housing unit 10 and the cooling unit 20, which is made of a plastic material, may be made of engineering plastic (EP), which is a high-performance plastic material that has excellent strength and elasticity and may withstand even a high-temperature condition, so that the engineering plastic may be substituted for a metallic material such as aluminum in the related art. More particularly, the junction part may be made of super engineering plastic having a working temperature of 150° C. or more in order to prevent deformation and damage caused by the coolant with a raised temperature during the process of cooling the power module M.

Therefore, the housing unit 10 may be manufactured by a plastic injection molding process, and the junction part 22 of the cooling unit 20 may be manufactured by a plastic insert injection molding process.

In addition, as illustrated in FIG. 1, in the housing unit 10, a first connector N1 having a nipple shape is provided on the coolant inlet port 12 to connect the coolant inlet port 12 and a coolant tube for supplying the coolant, and a second connector N2 having a nipple shape is provided on the coolant discharge port 13 to connect the coolant discharge port 13 and a coolant tube for discharging the coolant. The first connector N1 and the second connector N2 are also made of a plastic material identical to the material of the housing unit 10, such that the first connector N1 and the second connector N2 may be integrated with the housing unit 10 during the process of manufacturing the housing unit 10 by injection molding.

Further, as illustrated in FIGS. 2 and 4, in the present embodiment, an example is described in which the junction part 22 of the cooling unit 20 formed by the insert injection molding process is formed to surround only at least a part of the rim portion 21a of the cooling plate 21. However, the present invention is not limited thereto. As illustrated in FIG. 5, the cooling plate 21 has an insert groove portion 21b formed on at least one of one surface, on which the plurality of cooling fins is formed, and the other surface opposite to one surface. The insert groove portion 21b is concavely formed in a portion surrounded by the junction part 22 along the rim portion 21a of the cooling plate 21. The junction part 22 has an insert coupling portion 22b protruding along the insert groove portion 21b and having a shape corresponding to the insert groove portion 21b. The junction part 22 of the cooling unit 20 may surround the rim portion 21a of the cooling plate 21 while engaging with the rim portion 21a of the cooling plate 21.

As described above, because the junction part 22 of the cooling unit 20 surrounds the rim portion 21a of the cooling plate 21 while engaging with the rim portion 21a of the cooling plate 21 by means of the insert groove portion 21b and the insert coupling portion 22b, it is possible to further increase a coupling force between the cooling plate 21 of the cooling unit 20 and the junction part 22 formed by insert injection molding.

A structure and process for joining the housing unit 10 and the cooling unit 20 by plastic welding using a laser will be described more specifically. As illustrated in FIG. 3, the housing unit 10 includes a junction protrusion portion 10a protruding in a ring shape along a periphery of the opening portion 11. The junction part 22 of the cooling unit 20 may include a junction groove portion 22a concavely formed in a ring shape at a position corresponding to the junction protrusion portion 10a so that the junction groove portion 22a may accommodate at least a part of the junction protrusion portion 10a. In this case, the junction protrusion portion 10a may have a thickness T smaller than a width W of the junction groove portion 22a and have a height H larger than a depth D of the junction groove portion 22a.

Therefore, as illustrated in FIG. 3, when the cooling unit 20 is seated on the housing unit 10 so that the junction protrusion portion 10a and the junction groove portion 22a are matched with each other in shape, the cooling unit 20 may be seated in a state of being slightly spaced apart from the housing unit 10 because of the junction protrusion portion 10a having the height H larger than the depth D of the junction groove portion 22a. In addition, empty spaces may be defined at two opposite sides of the junction groove portion 22a because of the junction protrusion portion 10a having the thickness T smaller than the width W of the junction groove portion 22a. In this case, a gap between the housing unit 10 and the cooling unit 20 and an empty space of the junction groove portion 22a, which are illustrated in FIG. 3, are exaggerated to assist in understanding the invention. However, actually, a very fine gap and a very small space may be provided.

Therefore, as illustrated in FIG. 3, when laser beams L are emitted from a laser welding device (not illustrated) to the portion where the junction protrusion portion 10a and the junction groove portion 22a are matched with each other in shape, the junction protrusion portion 10a is melted, and the empty spaces of the junction groove portion 22a are filled with the molten junction protrusion portion 10a, such that the housing unit 10 and the junction part 22 of the cooling unit 20 may be joined to each other, as illustrated in FIG. 4.

More specifically, as illustrated in FIG. 3, the junction part 22 of the cooling unit 20, which has the junction groove portion 22a, is formed as a transmission layer that is made of a permeable plastic material and transmits the laser beam L. The housing unit 10 having the junction protrusion portion 10a is formed as an absorption layer that is made of an impermeable plastic material and absorbs the laser beams L emitted from the laser welding device. In this state, when the laser welding device emits the laser beams L to the portion where the junction protrusion portion 10a and the junction groove portion 22a are matched with each other in shape, the laser beams L may pass through the junction part 22 of the cooling unit 20, which is the transmission layer, and energy of the laser beams L may be absorbed by the junction protrusion portion 10a of the housing unit 10 that is the absorption layer.

Therefore, the junction protrusion portion 10a of the housing unit 10, which absorbs energy of the laser beams L, generates heat, the junction protrusion portion 10a is melted by the generated heat, the empty spaces of the junction groove portion 22a of the junction part 22 are filled with the junction protrusion portion 10a, and then the junction protrusion portion 10a is cured, such that the housing unit 10 and the junction part 22 of the cooling unit 20 may be joined to each other.

During the plastic laser welding process, the housing unit 10 and the junction part 22 of the cooling unit 20 may be compressed at a predetermined pressure by a compression device so that at least a part of the junction groove portion 22a, which is brought into contact with the junction protrusion portion 10a by heat generated and transferred from the junction protrusion portion 10a, may also be melted together with the junction protrusion portion 10a and then joined to the junction protrusion portion 10a.

During the above-mentioned process, the junction protrusion portion 10a and at least a part of the junction groove portion 22a, which comes into contact with the junction protrusion portion 10a, are melted together, such that the housing unit 10 and the junction part 22 of the cooling unit 20 may be joined to each other as the empty spaces of the junction groove portion 22a are filled with the molten material, as illustrated in FIG. 4.

In this case, the gap, which is formed between the junction part 22 of the cooling unit 20 and the housing unit 10 because of the junction protrusion portion 10a having the height H larger than the depth D of the junction groove portion 22a, may disappear as the junction part 22 of the cooling unit 20 and the housing unit 10 are brought into close contact with each other because the height H is decreased as the junction protrusion portion 10a is melted and because of the pressure applied by the compression device.

In addition, the melted plastic material needs to be completely cured to implement permanent coupling between the housing unit 10 and the junction part 22 of the cooling unit 20. Therefore, the compressed state between the housing unit 10 and the junction part 22 of the cooling unit 20 may be maintained for a predetermined time by the compression device even after the welding process using the laser beams L has ended.

As described above, the housing unit 10 made of an impermeable and the junction part 22 of the cooling unit 20 made of a permeable thermoplastic plastic are joined to each other by plastic laser welding performed by emitting the laser beam L, a junction between the housing unit 10 and the junction part 22 of the cooling unit 20 may be finished with high quality. Further, a junction, which is formed by melting the junction protrusion portion 10a and at least a part of the junction groove portion 22a that is in contact with the junction protrusion portion 10a, may be more securely formed while having strength equal to strength of an original material.

In addition, in the above-mentioned embodiment, as illustrated in FIG. 1, the example of the water-cooled heat dissipation module assembly 100 has been described in which the coolant inlet port 12 and the coolant discharge port 13 are formed at one side and the other side of the housing unit 10 while facing each other, the housing unit 10 has a flat shape, and a micro-channel is formed in the flow space in which the coolant flows. However, the shape of the housing unit 10 is not necessarily limited thereto. The housing unit 10 may be formed to be high in a height direction, the coolant inlet port 12 and the coolant discharge port 13 may be formed side by side at one side of the housing unit 10. In addition, various shapes of the housing unit 10 may be applied in accordance with the type of vehicles and the necessary cooling specifications.

Therefore, according to the water-cooled heat dissipation module assemblies 100 and 200 according to the embodiments of the present invention, a part of the cooling unit 20 is made of a plastic material, except for all the parts of the housing unit 10 and the portion where the plurality of cooling fins, which exchanges heat with the coolant, is formed. Because most of the components are made of a nonmetallic material, the weight of the product may be reduced, and energy efficiency of vehicles to which the product is applied may be improved.

In addition, the housing unit 10 and the cooling unit 20 are manufactured by plastic injection molding, which makes it possible to reduce the costs required to manufacture the components. Further, the housing unit and the cooling unit are integrated by being joined to each other by plastic welding using a laser, which makes it possible to improve manufacturability and reduce process costs.

While the present invention has been described with reference to the embodiment illustrated in the drawings, the embodiment is described just for illustration, and those skilled in the art to which the present invention pertains will understand that various modifications of the embodiment and any other embodiment equivalent thereto are available. Accordingly, the true technical protection scope of the present invention should be determined by the technical spirit of the appended claims.

The invention claimed is:

1. A water-cooled heat dissipation module assembly comprising:
   a housing unit provided in a form of a housing having an opening portion at least partially opened at one side thereof, the housing unit having therein a flow space in which a coolant flows, the housing unit including a coolant inlet port provided at a first portion thereof, and a coolant discharge port provided at a second portion thereof, so that the coolant is introduced into or discharged from the flow space; and
   a cooling unit provided in a form of a plate and coupled to the opening portion of the housing unit, the cooling unit including a plurality of cooling fins formed on one surface directed toward the flow space of the housing unit and configured to cool a power module attached to the other surface,
   wherein the housing unit and at least a part of a rim region of the cooling unit are made of a plastic material, and the housing unit and the cooling unit are joined to each other by plastic welding using a laser, wherein the housing unit is made of a plastic material, the cooling unit comprises:
- a cooling plate made of a metallic material and having a plate shape corresponding to a shape of the opening portion of the housing unit; and
- a junction part formed at a position corresponding to a periphery of the opening portion of the housing unit and made of a permeable plastic material, the junction part being formed along a rim portion of the cooling plate while surrounding at least a part of the rim portion of the cooling plate, and wherein the housing unit comprises a junction protrusion portion protruding in a ring shape along the periphery of the opening portion, and the junction part of the cooling unit comprises a junction groove portion concavely formed in a ring shape at a position corresponding to the junction protrusion portion so as to accommodate at least a part of the junction protrusion portion.

2. The water-cooled heat dissipation module assembly of claim 1, wherein the junction protrusion portion has a thickness smaller than a width of the junction groove portion and has a height larger than a depth of the junction groove portion.

3. The water-cooled heat dissipation module assembly of claim 1, wherein the housing unit having the junction protrusion portion is made of an impermeable plastic material and formed as an absorption layer that absorbs a laser beam emitted from a laser welding device, and
wherein the junction part of the cooling unit having the junction groove portion is made of a permeable plastic material and formed as a transmission layer that transmits the laser beam emitted from the laser welding device.

4. The water-cooled heat dissipation module assembly of claim 1, wherein the junction part is formed along the rim portion of the cooling plate by insert injection molding.

5. The water-cooled heat dissipation module assembly of claim 4, wherein the plurality of cooling fins made of a metallic material is formed on one surface of the cooling plate that is directed toward the flow space of the housing unit.

6. The water-cooled heat dissipation module assembly of claim 5, wherein the cooling plate comprises an insert groove portion formed in least one of one surface, on which the plurality of cooling fins is formed, and the other surface opposite to one surface, the insert groove portion being concavely formed in a portion surrounded by the junction part along the rim portion of the cooling plate, and
wherein the junction part comprises an insert coupling portion protruding along the insert groove portion and having a shape corresponding to the insert groove portion.

7. The water-cooled heat dissipation module assembly of claim 1, wherein the housing unit comprises:
- a first connector having a nipple shape, provided on the coolant inlet port, and configured to connect the coolant inlet port and a coolant tube; and
- a second connector having a nipple shape, provided on the coolant discharge port, and configured to connect the coolant discharge port and the coolant tube.

8. The water-cooled heat dissipation module assembly of claim 7, wherein the first connector and the second connector are made of a plastic material and integrated with the housing unit.

* * * * *